United States Patent
Alladio

(10) Patent No.: US 8,441,275 B1
(45) Date of Patent: May 14, 2013

(54) ELECTRONIC DEVICE TEST FIXTURE

(75) Inventor: Patrick J Alladio, Santa Rosa, CA (US)

(73) Assignee: Tapt Interconnect, LLC, Santa Rosa, CA (US)

( * ) Notice: Subject to any disclaimer, the term of this patent is extended or adjusted under 35 U.S.C. 154(b) by 344 days.

(21) Appl. No.: 13/005,707

(22) Filed: Jan. 13, 2011

Related U.S. Application Data

(60) Provisional application No. 61/295,057, filed on Jan. 14, 2010.

(51) Int. Cl.
*G01R 31/00* (2006.01)

(52) U.S. Cl.
USPC ............ 324/756.02; 324/762.02; 324/756.01; 324/762.03; 324/757.04; 439/65; 439/66; 439/67; 439/68; 439/69; 439/70; 439/71; 439/72; 439/73; 439/91; 439/525; 439/526

(58) Field of Classification Search ............ 324/756.02, 324/762.02, 756.01, 757.04, 762.03; 439/65–73, 439/91, 525, 526
See application file for complete search history.

(56) References Cited

U.S. PATENT DOCUMENTS

| | | | |
|---|---|---|---|
| 4,816,789 A * | 3/1989 | Mars ............................ 333/246 |
| 5,009,607 A * | 4/1991 | Gordon et al. .................. 439/67 |
| 5,289,117 A * | 2/1994 | Van Loan et al. ........ 324/754.08 |
| 5,299,939 A * | 4/1994 | Walker et al. .................... 439/74 |
| 5,376,882 A * | 12/1994 | Johnson .................... 324/750.24 |
| 5,427,536 A * | 6/1995 | Petersen et al. ................. 439/71 |
| 5,990,693 A * | 11/1999 | Hayes et al. ............. 324/756.02 |
| 6,045,370 A * | 4/2000 | Treibergs et al. ................ 439/73 |
| 6,106,316 A * | 8/2000 | Barringer et al. ............. 439/263 |
| 6,204,675 B1 * | 3/2001 | Moewes et al. .......... 324/750.03 |
| 6,293,804 B2 * | 9/2001 | Smith ............................. 439/66 |
| 6,299,459 B1 | 10/2001 | Botka et al. |
| 6,396,712 B1 * | 5/2002 | Kuijk ............................ 361/767 |
| 6,407,566 B1 * | 6/2002 | Brunelle et al. ......... 324/756.02 |
| 6,409,521 B1 * | 6/2002 | Rathburn ........................ 439/66 |
| 6,420,888 B1 * | 7/2002 | Griffin et al. ............ 324/754.11 |
| 6,932,619 B2 | 8/2005 | Chen |
| 7,119,564 B2 * | 10/2006 | Martens et al. .......... 324/750.23 |
| 7,135,703 B2 * | 11/2006 | Ham et al. ....................... 257/48 |
| 7,247,035 B2 * | 7/2007 | Mok et al. ........................ 439/81 |
| 7,247,042 B2 * | 7/2007 | Matsuo et al. ................. 439/330 |
| 7,287,997 B2 * | 10/2007 | Matsuo et al. ................. 439/330 |
| 7,403,029 B2 * | 7/2008 | Chong et al. ............. 324/755.05 |
| 7,621,761 B2 * | 11/2009 | Mok et al. ........................ 439/81 |
| 7,994,808 B2 * | 8/2011 | Alladio et al. ........... 324/756.01 |
| 8,228,083 B2 * | 7/2012 | Shen ........................ 324/750.26 |
| 8,278,955 B2 * | 10/2012 | Palaniappa et al. ...... 324/756.02 |
| 2001/0042636 A1 * | 11/2001 | Biron ............................ 174/254 |
| 2006/0192583 A1 * | 8/2006 | Ham et al. .................... 324/765 |
| 2006/0261837 A1 * | 11/2006 | Tsai et al. ..................... 324/765 |
| 2007/0057684 A1 * | 3/2007 | Chong et al. .................. 324/754 |
| 2007/0159188 A1 * | 7/2007 | Cram ............................ 324/751 |
| 2008/0218177 A1 * | 9/2008 | Alladio et al. ................ 324/555 |

(Continued)

*Primary Examiner* — Patrick Assouad
*Assistant Examiner* — Lamarr Brown
(74) *Attorney, Agent, or Firm* — Edward S. Sherman, Esq.

(57) ABSTRACT

An electronic device test fixture deploys a plurality of contact elements in a dielectric housing. The plumb arrangement of contact elements each include an armature or transversal configured to first depress and then slide laterally when urged downward by the external contacts of a device under test. The rotary movement of the transversal is optimized via the configuration of a surrounding forked regulator such that surface oxide deposition on the external device under test terminal is disrupted to reliably minimize contact resistance without damaging or unduly stressing the electrical junction of the device under test.

20 Claims, 16 Drawing Sheets

U.S. PATENT DOCUMENTS

| | | | |
|---|---|---|---|
| 2008/0224721 A1* | 9/2008 | Kim et al. | 324/761 |
| 2008/0297142 A1* | 12/2008 | Alladio et al. | 324/158.1 |
| 2009/0237097 A1* | 9/2009 | Palaniappa et al. | 324/754 |
| 2009/0302878 A1* | 12/2009 | Sherry et al. | 324/762 |
| 2010/0097085 A1* | 4/2010 | Takatori | 324/754 |
| 2012/0064738 A1* | 3/2012 | Shelsky et al. | 439/65 |

* cited by examiner

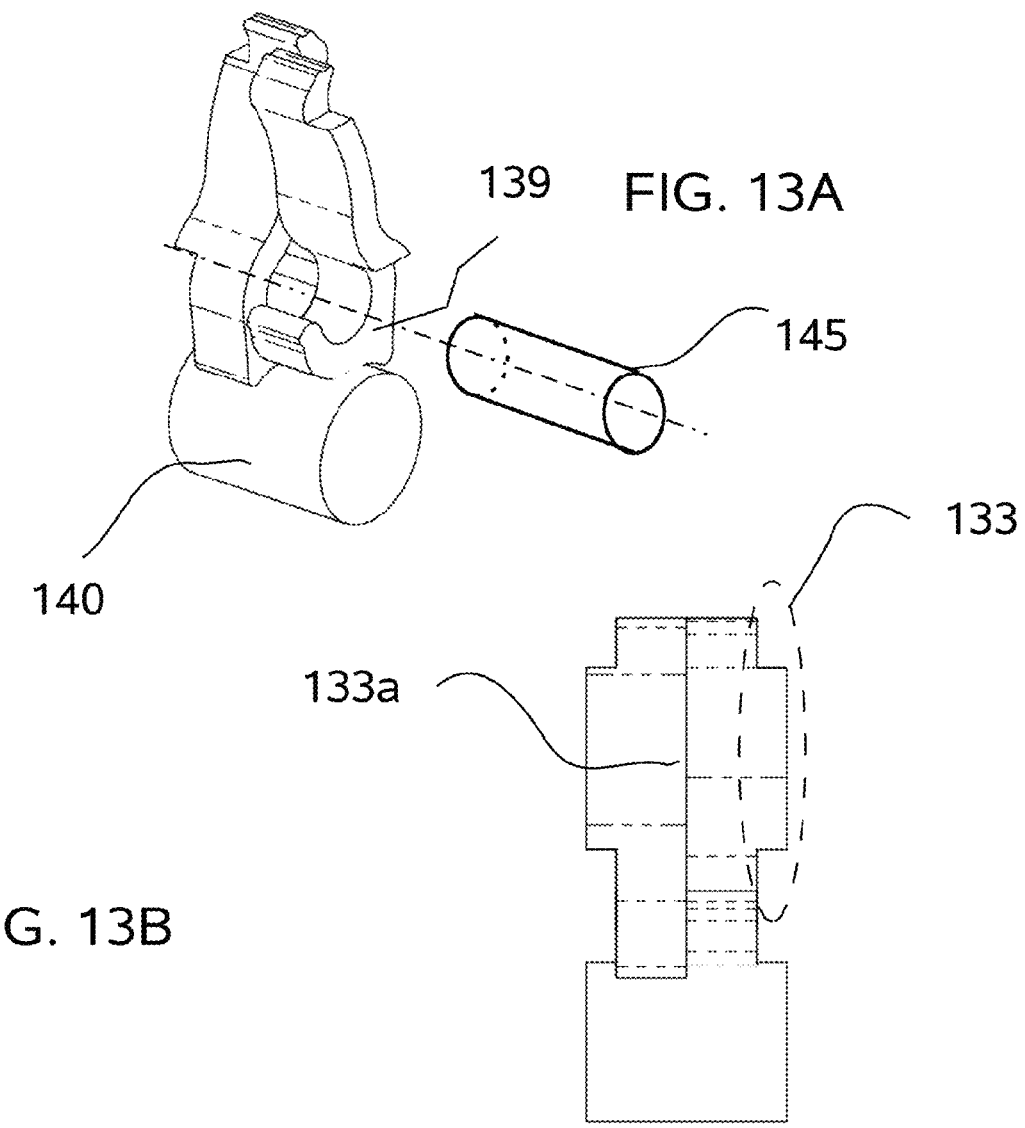

SECTION A-A

SECTION B-B

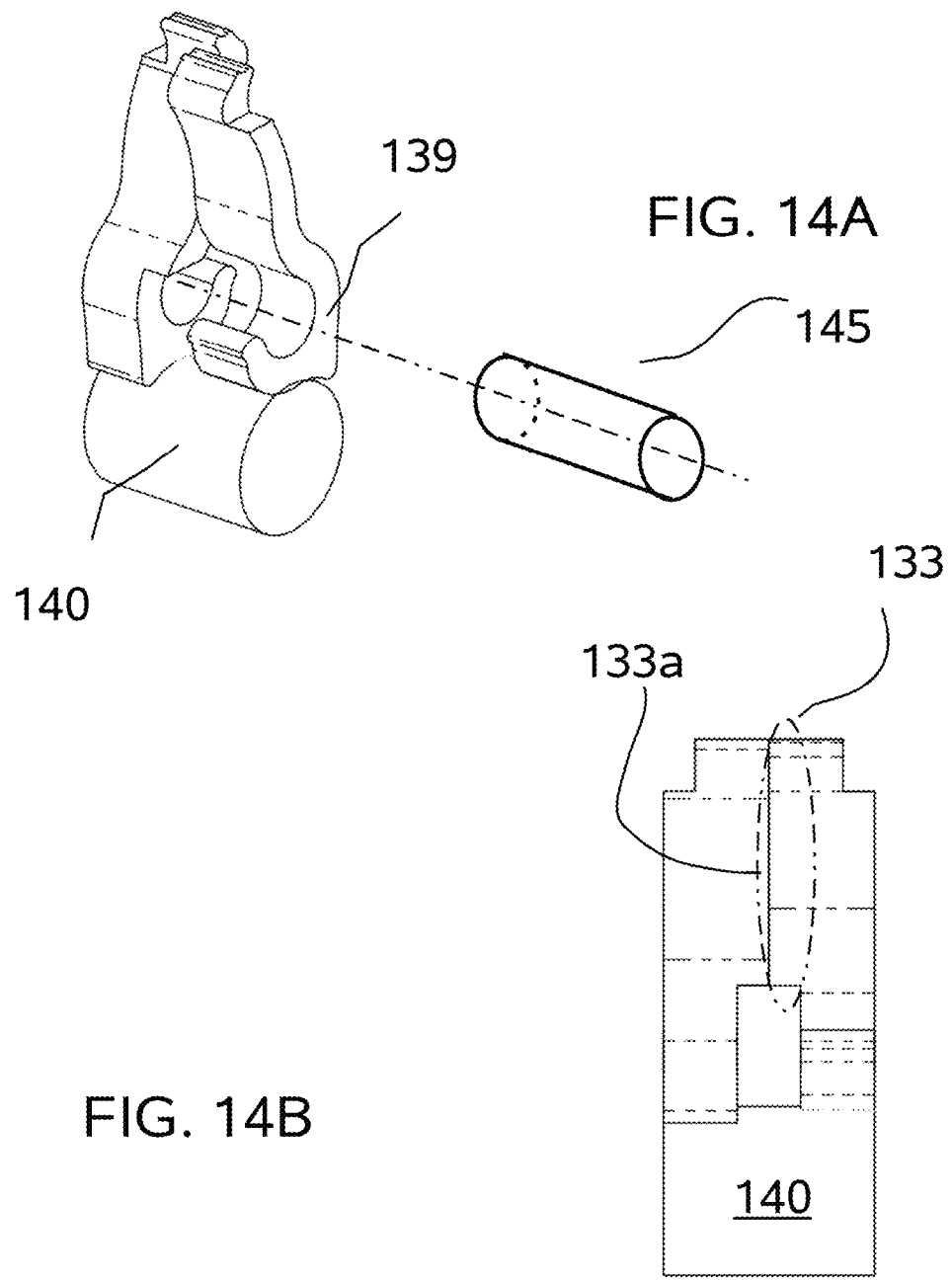

FIG. 14C
FIG. 14D
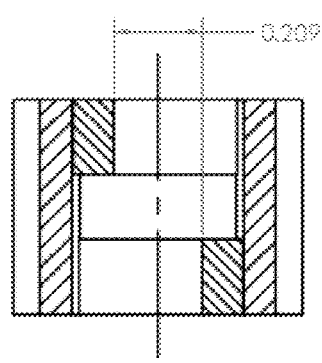
SECTION C-C
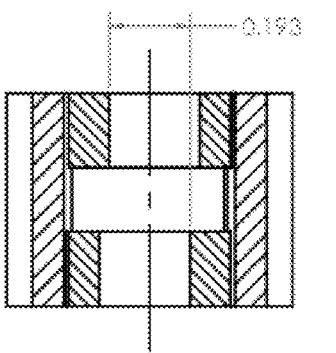
SECTION D-D
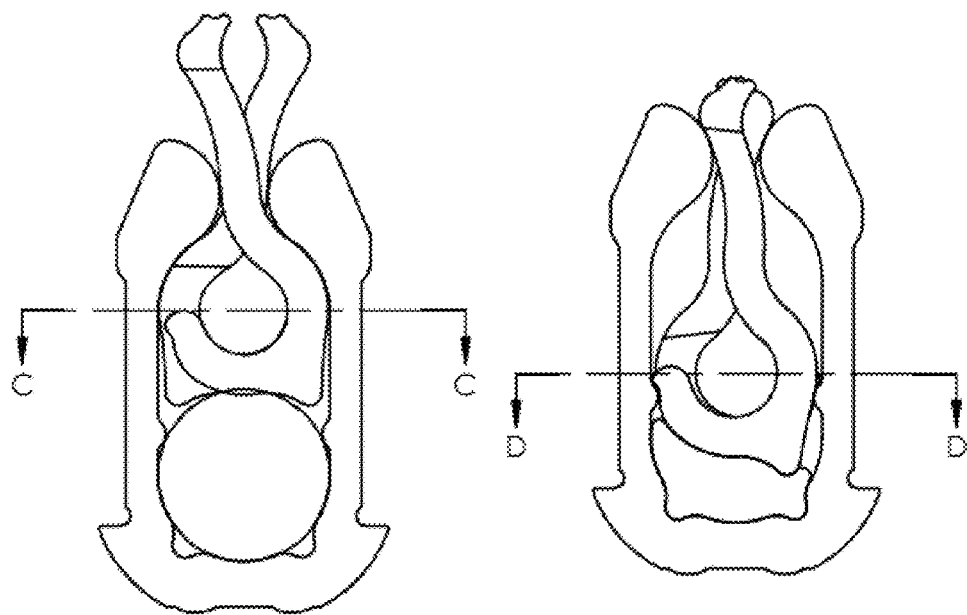
FIG. 14E
FIG. 14F FIG. 17A
FIG. 17B
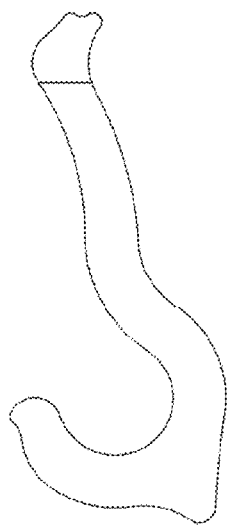
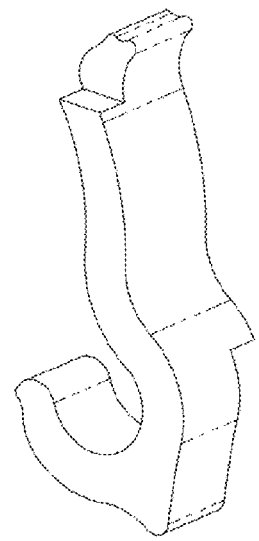

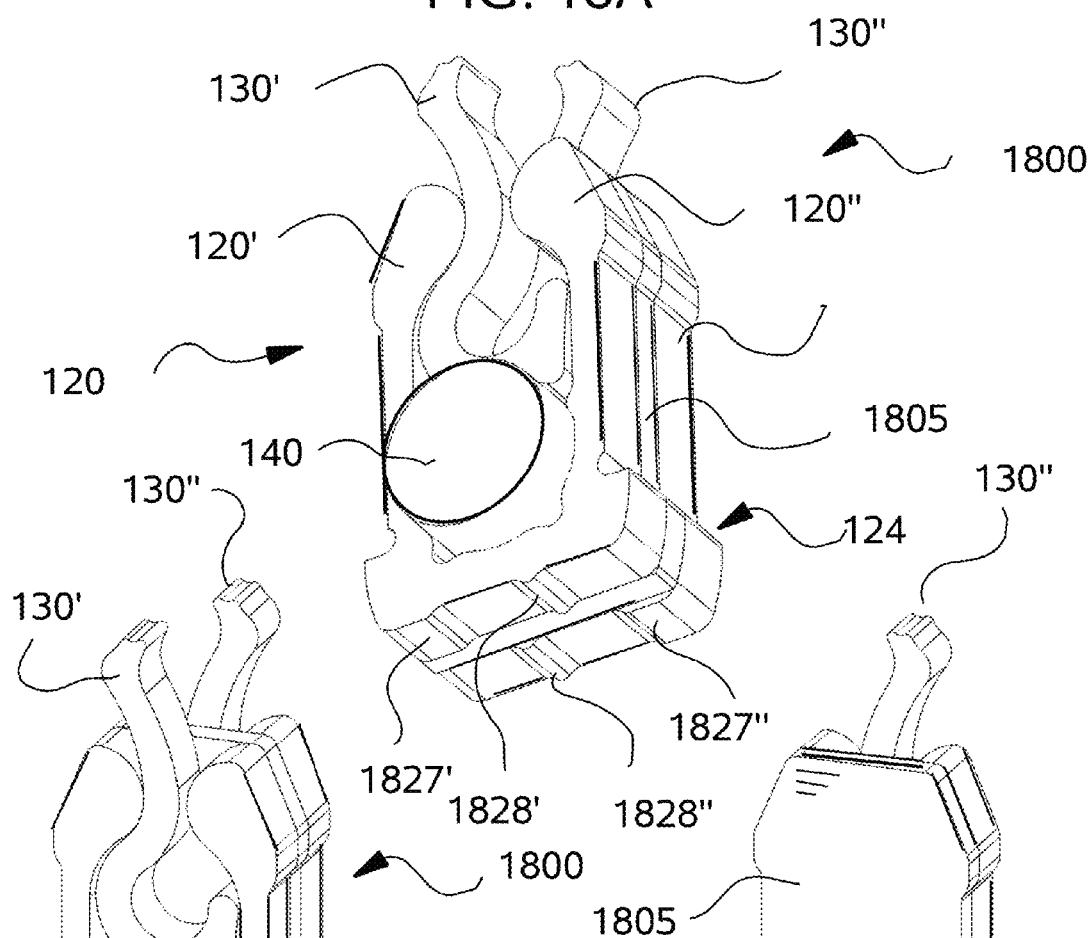
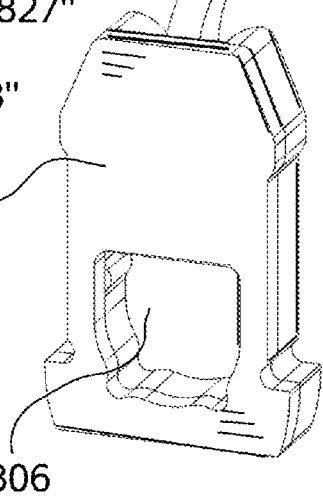
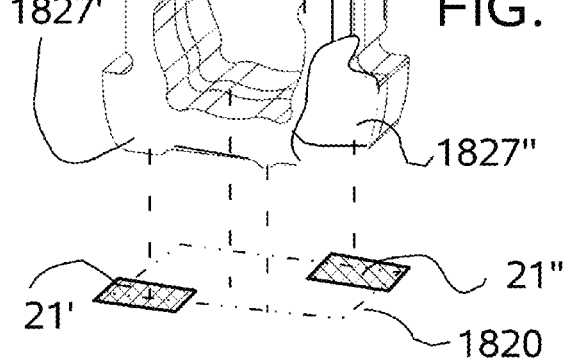
FIG. 18A
FIG. 18B
FIG. 18C

ELECTRONIC DEVICE TEST FIXTURE

CROSS REFERENCE TO RELATED APPLICATIONS

The present application claims the benefit of priority to the US provisional patent application of the same title, having application Ser. No. 61/295,057, that was filed on Jan. 14, 2010, which is incorporated herein by reference.

BACKGROUND OF INVENTION

The present invention relates to a test fixture for integrated circuits.

Microelectronic integrated circuit (IC) device fabrication technologies have focused its design techniques and materials to produce smaller and faster operating devices with greater functionaries and a higher culmination of I/O numbers; corresponding to a compact finite accruement comprising a terminal pitch. This trend towards miniaturization has led to demand for improved semiconductor contactors (fixtures) and interconnect performance. On center architectures of fixturing are typically targeted to (BGA) ball grid array, (LGA) land grid array, and dual row (QFN) quad flat no lead, etc., market segment package types with dense order formations. Pogo pin technologies and other linear practical design techniques establish a temporary connection between the (DUT) device under test and the load board or (PCB) printed circuit board. The characteristic contact condition and mechanism of these recognized standard designs is the sole coercion of compliancy distinctly supplying a force to penetrate through DUT lead oxides or residue without accumulation or embedment of debris in order to deliver an uncontaminated interface through the means of contact pressure to achieve low and stable contact resistance followed by consecutive recurring touchdowns with each DUT. The operative function for electronic junction of the DUT typical for on center architectures widely practiced, i.e., spring pins, fuzz-button hardhat, permeated conductive elastomer, flex particle interconnect, or conductive epoxy bump primarily rely on dynamics of contact penetration or dent exclusive acts. This contestable lone nature of electrical contact operation combined with the various sharp crown tips on most spring probes' prior art to provide repeatable, positive contact to the DUT terminal is organic contamination, particle debris, and surface film trace element permeation of the crown tips' service that can lead to high contact resistance, false contact failure rejects, and raise frequent spring probe tip cleaning intervals ceding to test down time; equating to profitable loss proportions in semiconductor production test facilities. Another common class of contactor offers an oblique connection or offset structure amongst the DUT terminal and PC board providing contact pin compliance along with an amount of translation conduct on the DUT terminal surface. It is believed that those skilled in the art have tolerated or neglected to fully appreciate the potential adverse effects on performance and reliability issues arising with the emergence of this technique constituting the collateral launch or branch from the load board to the contactor.

The required size and location for the contactors' recipient PCB pads may affect the capacitance on the surface of the load board. Related to the DUT frequency of interest, load board compensations are likely to be addressed elsewhere in order to optimize signal integrity for this type of interface.

Accordingly, prior methods of testing IC's including many prior art reduced scale sockets that exert self-part contact embodied treatments thataway bend, distort, deflect, or twist allowing for vectorial compressive forces that are prone to soften or rupture over repeatedly burdened motions of self-activity and are likewise not aftereffect suitable for all package and contact types, and pose greater reliability challenges as I/O counts both grow and the spacing between external contacts decreases.

It is therefore a first object of the present invention to provide a stable, repeatable electrical contact through the use of coincident compliance coupled with lateral directional movement(s) to the DUT terminal to break through oxides, emulsion, residue, and mold release film.

Another object of the invention is to provide sufficient contact (contacts) with less force, thus preservation to the DUT pad/ball surface minimizing alteration or deformation.

Yet an additional object of the invention is to provide increased testing accuracy, reliability and minimize the need for retest.

Others objective of the invention are to minimize the potential for device/IC damage, among them die-cracking of the product under test, to provide longer test fixture cycle life, decreases cost of ownership, longer mean time between assists or repair, improves test yields, provide the flexibility to work with different package types and scale formats including (BGA and LGA with high I/O counts)

Summary of Invention

In the present invention, the various objectives are generally achieved by providing test module comprising a dielectric housing with a plurality of cavities, a forked regulator disposed in at least a portion of the plurality of cavities and having a base and a pair of arms extending upward from the base, at least one transversal disposed in rotary engagement within said forked regulator and having; a rounded basal region for permitting rotary motion within the regulator, and an armature extending upward from the basal region for making a signal transmitting contact with the external terminal of a DUT, and means for rotary movement of the transversal basal region in the regulator whereby an electrical contact impinging vertically on the armature results in the vertical and then horizontal movement thereof with respect to the initial point of contact therewith.

In the present invention, the various objectives are generally achieved by providing test module (a test module) for supporting and making electrical contact and external signal connection to a device under test (DUT) having a plurality of external terminals, the test module comprising a generally planar dielectric housing having an upper surface, a lower surface and a plurality of cavities that extend generally vertically from the upper surface to the lower surface, a forked regulator disposed in at least a portion of the plurality of cavities and having a base and a pair of arms that extend upward from the base, at least one transversal disposed in rotary engagement within said forked regulator and having; a rounded basal region for permitting rotary motion within the regulator, and a curved armature extending upward from the basal region beyond the pair of arms of the forked regulator and terminating in an upper appendage having an upward facing surface for making a signal transmitting contact with external terminals of a DUT, means for rotary movement of the basal region of the transversal within said forked regulator whereby an external terminal of a DUT impinging vertically on the upper appendage results in the vertical and then horizontal movement in a first lateral direction thereof with respect to an initial point of contact of the external terminal of the DUT In another more preferred embodiment of the invention, the forked regulator and the transversal of the test module are electrically conductive and make multiple point of contact with each other when the external terminal of the DUT are urged vertically downward on the test fixture such that the upper appendage thereof first undergoes a vertically downward displacement and then horizontal movement in a first lateral direction thereof with respect to an initial point of contact with the external terminal of the DUT.

In another more preferred embodiment of the invention, the test module further comprises a second transversal disposed in rotary engagement within said forked regulator and having; a rounded basal region for permitting rotary motion within the regulator, and a curved armature extending upward from the basal region beyond the pair of arms of the regulator and terminating in an upper appendage having an upward facing surface for making signal transmitting contact with the same external terminals of the DUT as the first transversal, wherein each transversal undergoes rotary movement in the opposite direction of the other transversal within the region of the regulator between the base and the pair of arms that extend upward from the base.

The above and other objects, effects, features, and advantages of the present invention will become more apparent from the following description of the embodiments thereof taken in conjunction with the accompanying drawings.

BRIEF DESCRIPTION OF THE DRAWINGS

FIG. 13A is a perspective view of a pair of adjoining transversals in FIGS. 6A/B disposed above the projected elastic member omitting the regulator, whereas FIG. 13B is a front elevation view thereof. FIGS. 13C-D are plan cross-sectional views of the same adjoining transversal in the uncompressed and compressed states respectively, whereas

FIG. 14A is a perspective view of another pair of adjoining transversals also disposed above the elastic member omitting the regulator but in reversed orientation with respect to the nearest portion touching the projected elastomer of the adjoining transversals possessing a detached construction to each other from the embodiment shown in FIGS. 13A-F whereas FIG. 14B is a front elevation view thereof. FIGS. 14C-D are plane cross-sectional views of the same adjoining transversal in the uncompressed and compressed states respectively, whereas FIGS. 14E and F are the corresponding cross-sectional elevations.

FIG. 17A is an external elevation of a particular embodiment for the transversals of FIGS. 14A and 14B.

FIG. 17B is a perspective view of the transversal in FIG. 17A.

FIGS. 18A-C illustrate alternative embodiment of portions of the test fixture with a regulator adapted for Kelvin testing, in which FIG. 18A is a perspective view thereof that includes the elastic cord, FIG. 18B is a cut-away perspective view omitting the elastic cord but showing how each half of the regulator contacts a separate test pad and FIG. 18C is a partial perspective view omitting the front half of the regulator associated with the forward transversal to illustrate the dielectric bridge or spacer plate.

DETAILED DESCRIPTION

Figure 1A:
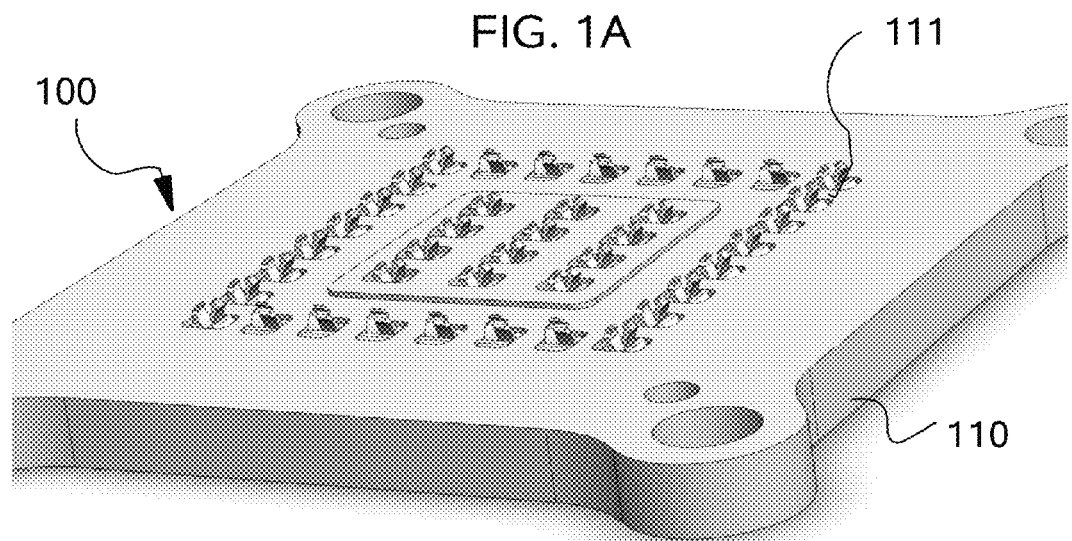
FIG. 1A is a perspective view of test module

Referring to FIGS. 1 through 18, wherein like reference numerals refer to like components in the various views, there is illustrated therein a new and improved Electronic Device Test Fixture, generally denominated 100 herein.

Electronic device test fixtures commonly deploy a plurality of contact elements in a dielectric housing (or holder) to coincide with the microcircuits' terminal locations. The contact elements are able to make repeated electrical connections with thousands of DUT's at the upper side of the test fixture to conduct signals to the test circuit board of the instrument test head platform generally below.

In accordance with the present invention, FIG. 1A illustrates a general embodiment of the test fixture 100 that comprises a housing 110 with a plurality of cavities 111. The test fixture 100 is disposed between test board 20 that has a series of terminals 21 and the DUT 10 with its series of pads 11 or other exposed external electrical terminals or contacts.

Generally, each of the cavities 111 has at least one forked regulator 120 and at least one transversal 130 having a rounded basal region 132 for permitting rotary motion within the regulator 120. The forked regulator 120 has 2 upward extending arms 121 and 121', which are connected to a base 124 to define a U shape. Preferably the lower surface of the base 124 region has at least 2 surface ridges 127 and 127' that are intended to make electric contact with the test board 20.

Figure 1B:
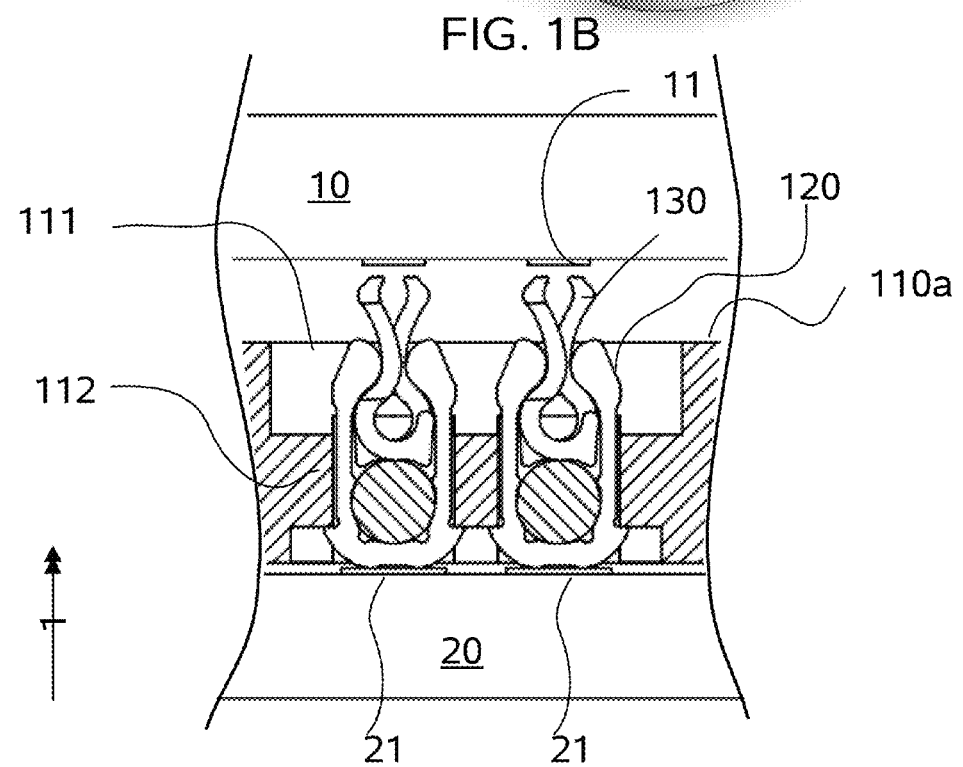
FIG. 1B is a cross-sectional elevation view of a portion of the test module in FIG. 1A showing a portion of the DUT and the load board.

The base region 124 of the forked regulator 120 preferably has two outwardly projecting external flanges 125 and 125' for containing it within said cavity 111, as the flanges aggregate extension is slightly wider than the smallest channel formed in cavity 111 as shown in the cross-section elevation view FIG. 1B. Thus, the cavity 111 has a narrow central portion, with a wider lower portion below it that extends to the bottom or lower surface of the test fixture, the connection there between providing ledges or shoulders that contain flanges 125 and 125'. More preferably, the cavity also has a wider upper portion that extends to the upper or top surface of the test fixture from the narrower central portion.

The upper extremities 126 and 126' of the forked arms 121 and 121' respectively widen to form a choke region 122 having narrow gap 129 to contain a outward curving armature 131 of the transversal 130. It should also be appreciated that for optimal operation of the test device 100 the upper portion of the choke 122 extends above the housing secondary top surface 110a. It is also preferable that the upper extremities 126 and 126' of the choke 122 are disposed diagonally or canted inward to provide a lead-in lock with the housing 110, but also to confine the rounded basal region 132 of the transversal 130 within a bell shaped cavity defined by the shape of the facing internal surface of the regulator choke 122.

The housing 110 is preferably made of injection or compression molded plastic, such as a thermoplastic, dimensionally stable polymer type resin. The holes (features) may be fabricated by means including but not limited to machined, molded, or laser cut in as a separate finishing step.

The movement of the transversal 130 is preferably optimized via the configuration of a surrounding forked regulator 120 such that surface oxide on the (external) exposed contact 11 of the DUT 10 is disrupted to reliably minimize contact resistance without damaging or unduly stressing the DUT device under test contact terminals. The inflection curvature of the upward face surface at the end of the transversal's upper appendage 136 thus strokes the DUT terminals' surface layer preparing a refreshed pad/ball face composition by its behavioral function with the regulator 120. The test fixture 100 addresses industry challenge related to Pb-free (Lead element) interconnect performance results. The design as intended concerns discourse of DUT contacts 11 comprising Matte Sn comparatively and inherently softer than SnPb. Other numerous interconnect fixtures are susceptible to buildup contamination of this softer known platen. Additionally the means for NiPdAu plating compositions of DUT contacts 11 by which are 20 times harder than standard solder alloys. Typical industry lead-free forward trends on DUT contacts 11 flat pad, leaded, LGA package scales currently harnessed are Matte Sn, NiPd, NiPdAu, SnBi, and Au flash composites. DUT contacts 11 compounds on some BGA package scales generally frequent SAC304/5 a solderable makeup consisting of SnAg 3.0-4.0 Cu 0.5 principal parts of lead-free alloy.

As will be further described below, in the various embodiments both the forked regulator 120 and at least one transversal 130 can preferably deploy addition features and components to insure their dynamic interaction provides a range of precise movement and resistive forces as the external contacts on the DUT come into contact. The novel configuration can be optimized to conduct for different DUT external contacts to reliably meet the various objectives of the invention. The novel configuration can be optimized for different external terminals to reliability meet the various objective of the invention. However, the specific form of the features and components described and illustrated herein can be combined in additional combinations and are not limited to the exact illustrations of the specification.

Figure 2A:
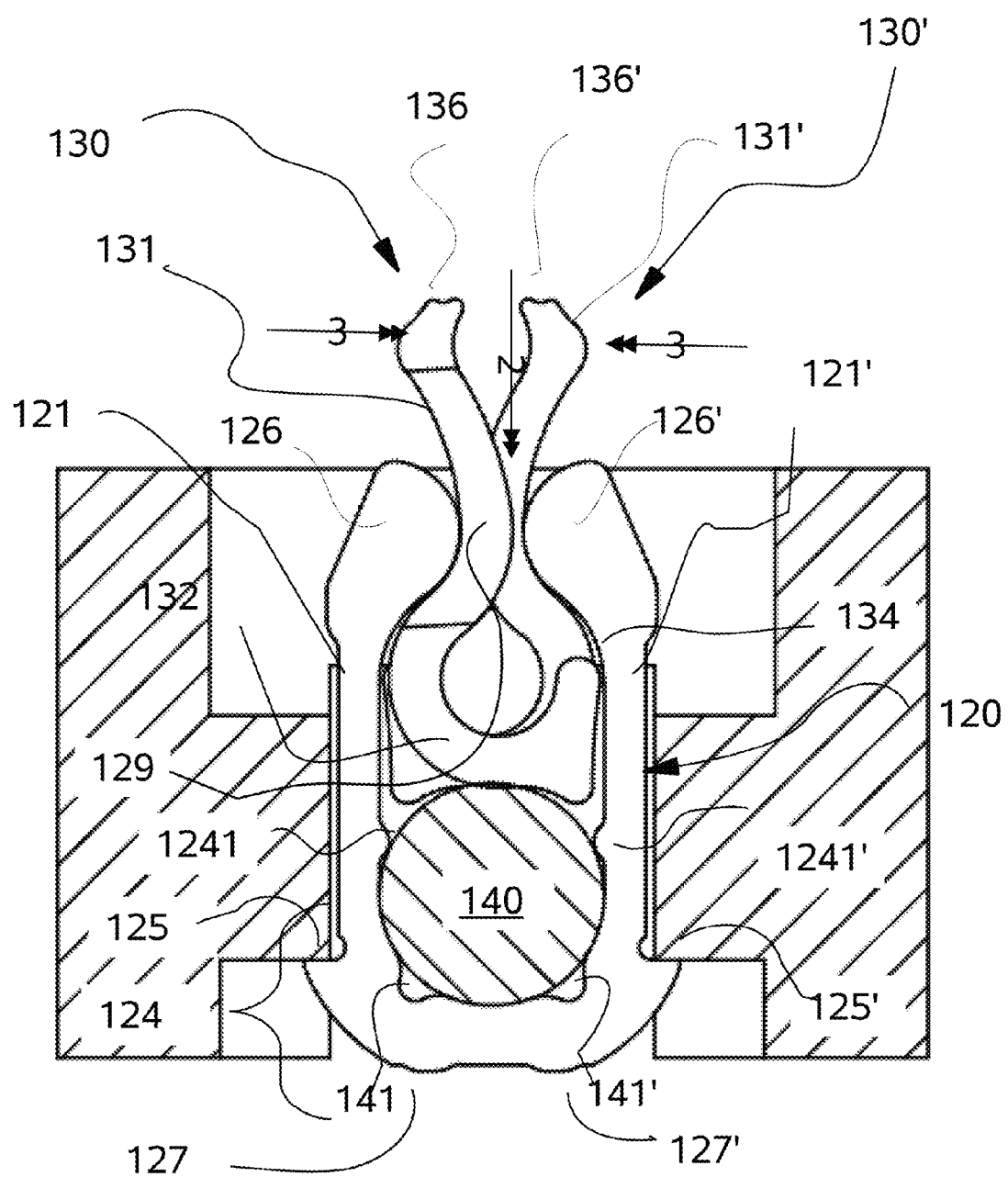
FIG. 2A is a cross-sectional elevation view of an uncompressed transversal and forked regulator with a cavity of the test module of FIG. 1A.
Figure 2B:
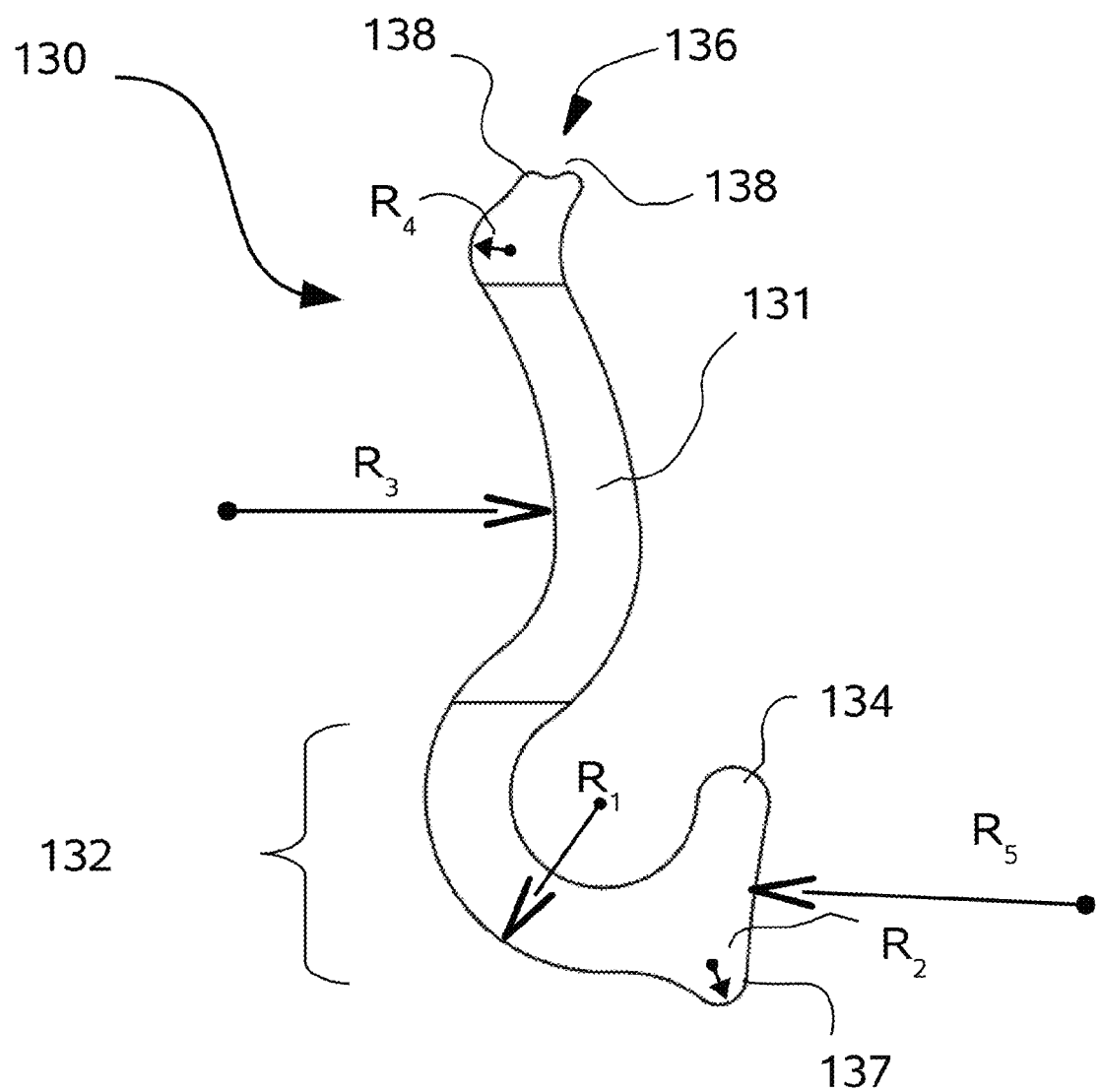
FIG. 2B is an elevation view of the transversal of FIG. 2A.
Figure 3:
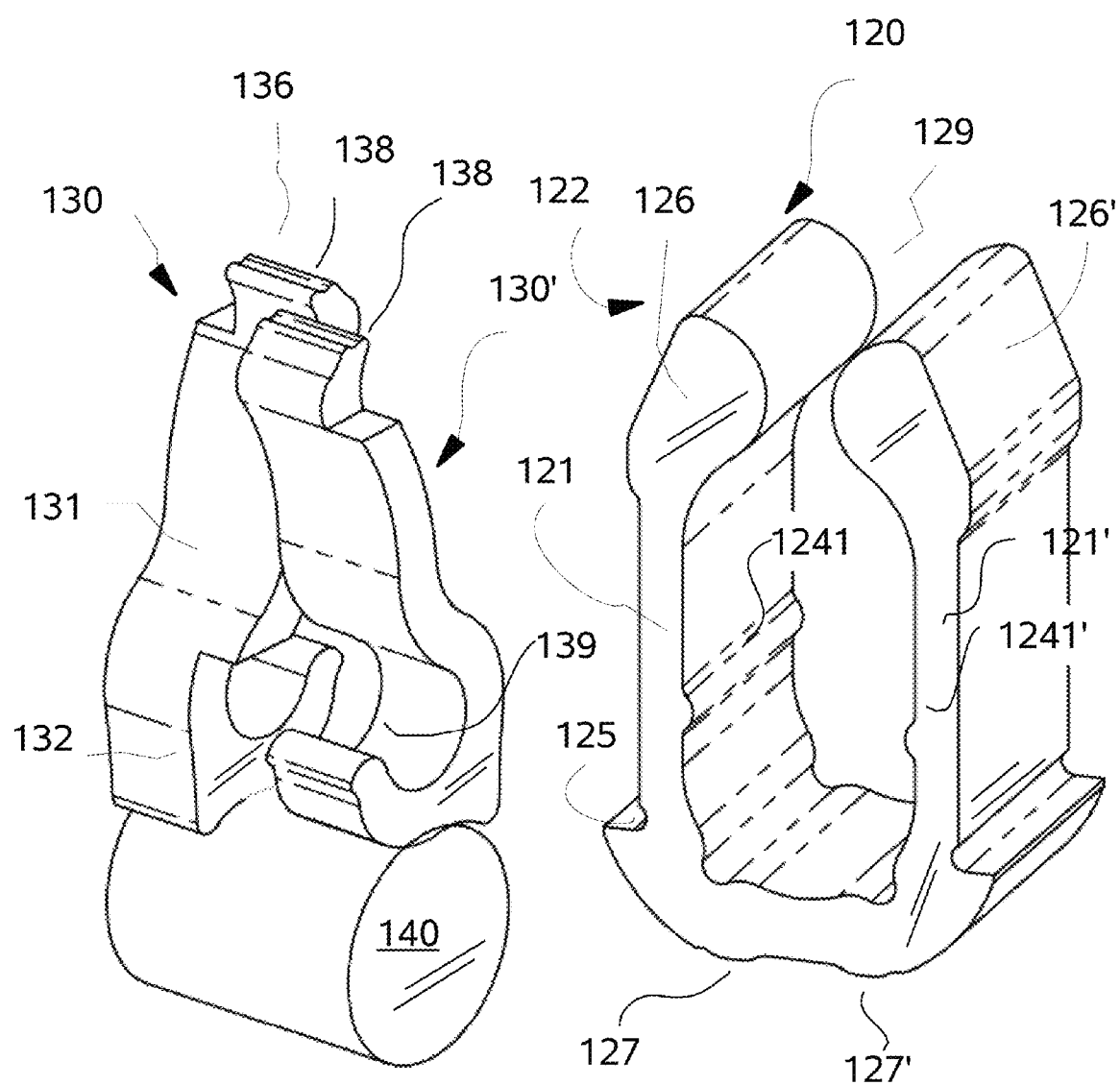
FIG. 3 is an exploded perspective view of another embodiment of the uncompressed transversal and forked regulator

As shown in further detail in FIG. 2B, a transversal 130 preferably has an outward curving armature 131, that can be characterized at least in part by a radius $R_3$ that terminates in a upper appendage 136. The upper appendage 136 is intended to form the low resistance electrical contact to the external contact 11 of the DUT via a series of parallel ridges 138 disposed perpendicular to the plane of FIG. 2B. Depending on the type of external contact 11 deployed on the DUT 10, the common plane defined by the peaks of these ridges 138 may be canted inward. The inward canting is preferably achieved by tilting the transition between the curving armature 131 and the upper appendage 136, which can be characterized by an adjoining radius $R_4$. The unsparing mechanical compliance of the conjugate contact elements 120, 130 and 130' will fluently accommodate DUT contacts 11 height variations or non-planarity's thereof which are occupied and with respect to the DUT 10 floor (substrate). Thus, both forked regulator 120 and at least one, but preferably both transversals 130 and 130' are conductive metal alloys that make coincident tangential surface sliding electrical contact with each other, such that signal can pass from the external DUT contact 11 to the contact 21 on the load board 20, which is contacted by the basal region 124 of the forked regulator 120. As will be further explained below, multiple and thus redundant points of electrical contact preferably occur between each of the conductive components as the DUT terminal 11 engages the test device 100 and the test device 100 engages the conductive pads 21 on the face of the test board 20. One familiar in the art will appreciate the test fixture 100 ability of small electrical signal length to attain low parasitic DUT performance amongst a pair of regulator surface ridges 127 and 127' junctions to the test board terminal 21; and a pair of upper appendages 136 and 136' junctions of related 130 and 130' transversals to a single DUT terminal 11 devisable to manifest a motionless post junction and present for repeatedly cycled juncture(s) respectively that are not of mechanical equivalence. The regulator 120 and transversal 130, though capable of providing some function when fabricated from a conductive plated metal, are optimally non-plated noble alloys formed of a high conductive order of metals to maintain lower contact resistance and longer life amongst the accompaniment of the sliding components themselves and the repetitious attrition of DUT presentment. One such noble alloy is Au Cu Pd Ag. Alloy geometries may be fabricated by means of laser cut, etching process, or through electrolytically wire burn displosion.

In a more preferred embodiment(s), a second transversal 130' inversely adjacent the first 130, rotates in the opposite direction in the same manner. Thus, preferably two mirror image transversals 130 and 130' are disposed within the forked regular 120, each facing the other being generally confined by the surrounding basal region 124 and the extending arms 121 and 121' respectively.

Transversals 130 and 130'are also laterally adjacent to provide the scissor movement toward each other their upward extending armature 131 extending from the basal region 132 for making a signal transmitting contact with the external terminal 11 of DUT 10. The shape of the curving armatures 131 is optimized such that as the transversal 130 is urged downward by the DUT the choke region 122 of the forked regulator 120 applies a lateral force to urge them both inward and downward, roughly case the contact tip of the ridges 138 on the upper appendages 136 to follow the path 4 shown in FIG. 4. Toward the end of this motion the regulator and each transversal have multiple point of contact with each other. Notably the choke region in the relaxed state of the device has an initial opening or width between the two appendages on opposite arms at their closest point of approach. As this point of closest approach is in the vicinity of the transversal portion with radius $R_3$, that is between $R_4$ and $R_1$, the opposite rotation of the two transversals 130 and 130' will apply localized force vectors to the upper surface extremities 126 and 126' of forked arms 121 and 121' on regulator 120 amidst the support of cavity 111 of housing 110 central protuberance 112 to administer an unyielding carriage. The resistance of the regulator 120 surrounded by this standby buttress will transmit a corresponding contact force between the transversal and the regulator near the top portion, with radius $R_3$, of the transversal.

Further, the bottom of the transversal and the inside surface of the regular have abutment or protrusion from the generally smooth shape to similarly local region with a higher contact stress to provide a redundant electrical signal pathway between the contacts 11 on the DUT 10 and the test board 20. As these points of contact or friction also mean a greater resistance to downward and/or lateral movement of the transversal(s) this also exerts an increase in force and a temperate order of hertzian stress motion distributions on contact surfaces between the transversals' upper appendage 136 surfaces and the contact 11 on the DUT 10.

Preferably, the cavity 111 in housing 110 has a central protuberance 112 that causes it to narrow in the central region for supporting the forked regulator which is intended to be inserted from the bottom in the direction of the arrow 1 in FIG. 1B. The central protuberance can also be consider as a narrowing of the central portion of the cavity between the upper and lower surface of the text fixture such that there is a lower opening that extends downward from the central portion to the lower surface with a width that is larger than that of the central portion, and preferably also an upper opening that extends upward from the central portion to the upper surface with a width that is larger than that of the central portion.

In the various embodiment of the test fixture 100 there can be deployed various means for rotary movement of the transversal basal region 132 in the regulator 120 as the transversal is depressed by the DUT, resulting in primarily vertical then horizontal load on the external terminal 11 of a DUT 10.

More preferably, the engagement of the choke region 122 of the forked regulator 120 provides for the general downward guidance and inward movement of the transversal's 130 upper appendages 136 and 136' that contact the DUT and is optionally resisted by the various resilient means such that the contact pressure and shear forces exerted by the appendage against the DUT contact 11 is high enough to disrupt oxide layers and make quality ohmic contacts during the test. Further embodiments described below describe such preferred resilient means when used with specific embodiment of the other components to optimize test performance for difference DUT I/O lead types.

Figure 4:
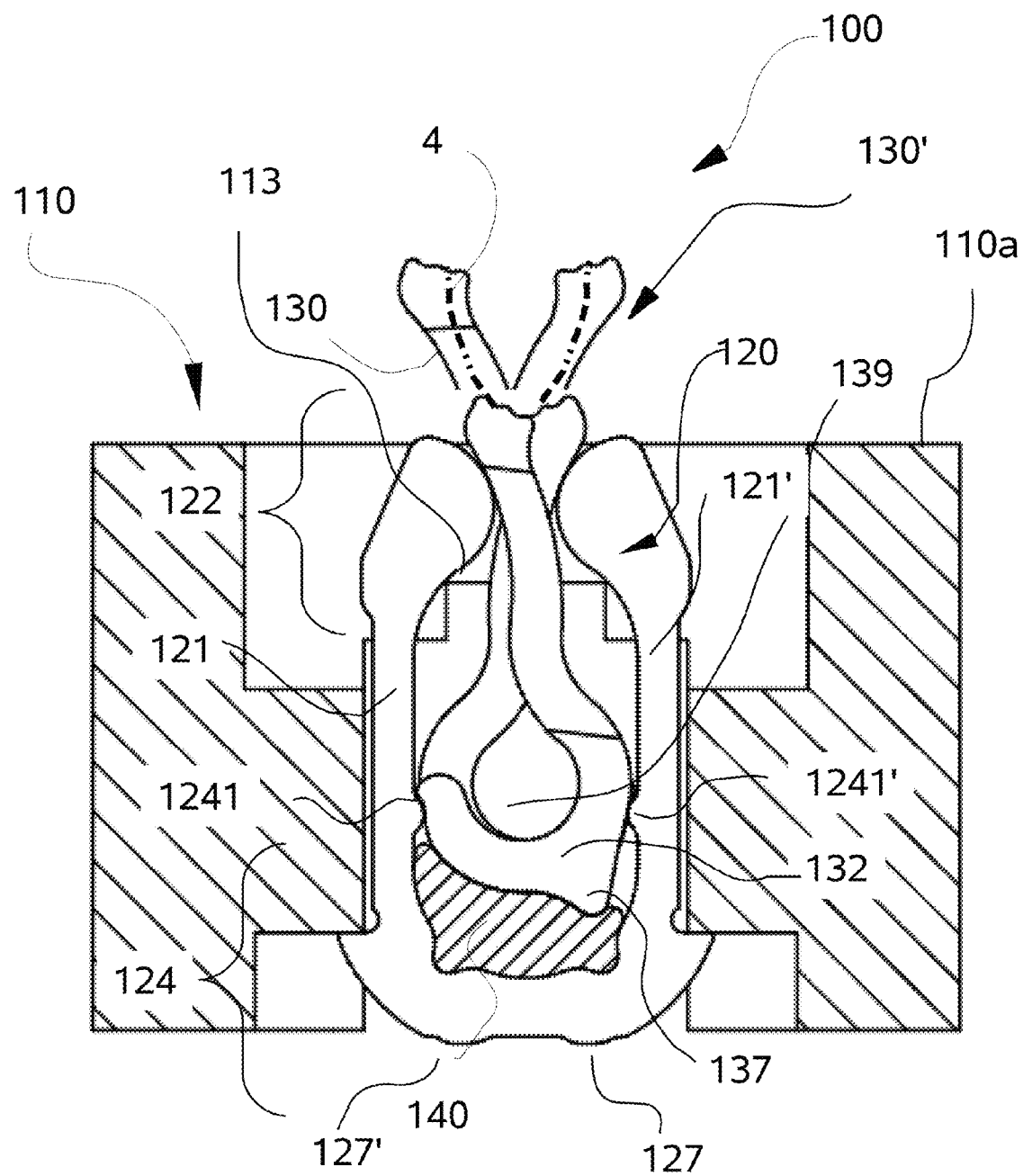
FIG. 4 is a perspective view of the compressed transversal of FIG. 2A.

Generally such resilient means are preferably provided by an elastic cylinder 140 disposed above the base 124 of the forked regulator 120 and below the basal regions 132 of the transversals 130, which is shown compressed in FIG. 4. Accordingly, the basal region 124 of the forked regulator 120 facilitates areaway relief voids 141 and 141' to tune compressional energy of the transversal 130 and tone vital displacement press volumes and functional stress factors for the bias cord 140.

Another elastic cylinder or resistant filament member 145 can be disposed to extend through the cylindrical cavity or lumen 139 defined by the adjacent inner surface of the basal region 132 of the adjacent transversals 130 and 130', just as cylinder 140 extends below them, as shown in FIG. 13A and FIG. 14A. Cylinder 145 is able to afford a preloaded basal region of lower surface ridges 127 and 127' on regulator 120 to adjoin with terminal 21 of test board 20 whereby cylinder 145 undertakes slight deflection with surface 113 (FIG. 4) of housing 110 when mounted to test board 20 with transversals 130 and 130' in uncompressed stature.

Figure 5A:
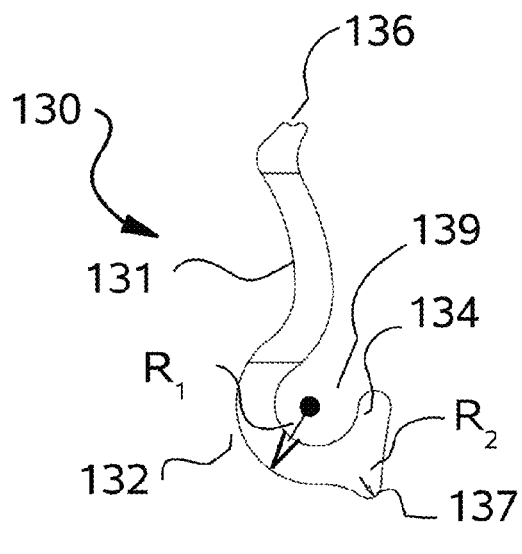
FIG. 5A is an external elevation of a particular embodiment for a transversal
Figure 5B:
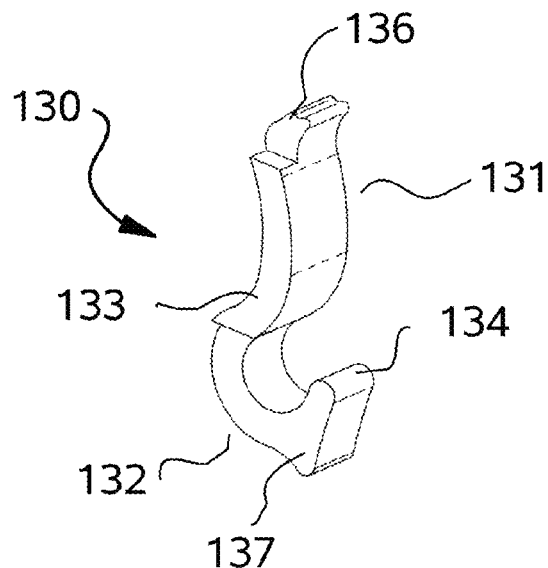
FIG. 5B is a perspective view of the transversal in FIG. 5A

FIG. 5A and FIG. 5B illustrate an alternative embodiment of the transversal 130 having in the rounded base region 132 a curved surface appendage 137.

This curved surface appendage 137 is disposed proximate to the end 134 of the basal region 132 which is separated from the armature portion 131 such that the transversal has a curving hook shape, the hooked portion capable of being characterized at least in part by radius $R_1$ in FIG. 2B.

Figure 6A:
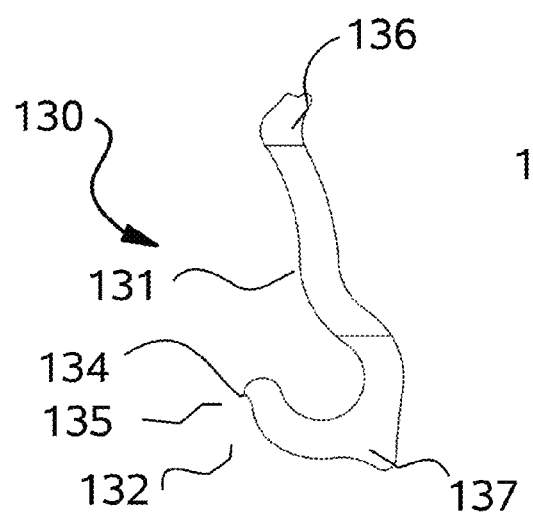
FIG. 6A is an external elevation of a particular embodiment for a transversal
Figure 6B:
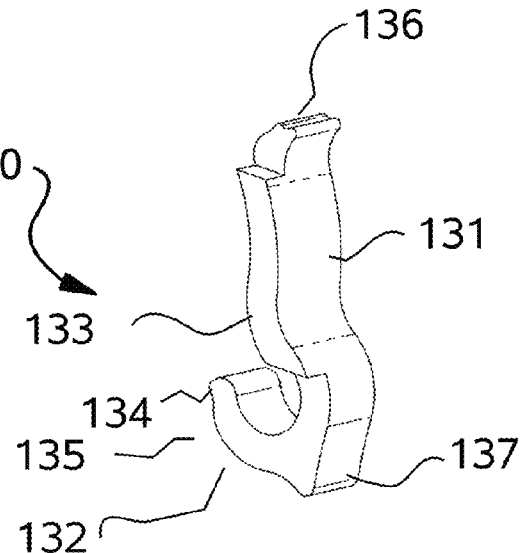
FIG. 6B is a perspective view of the transversal in FIG. 6A
Figure 7A:
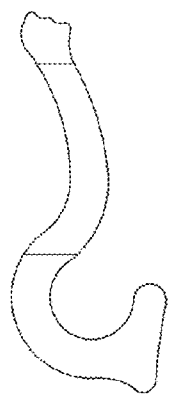
FIG. 7A is an external elevation of a particular embodiment for a transversal
Figure 7B:
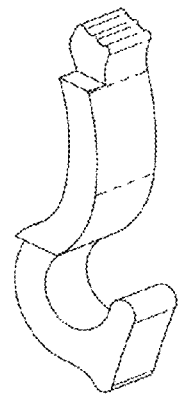
FIG. 7B is a perspective view of the transversal in FIG. 7A
Figure 8A:
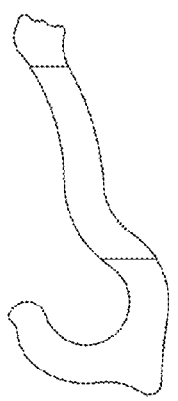
FIG. 8A is an external elevation of a particular embodiment for a transversal
Figure 8B:
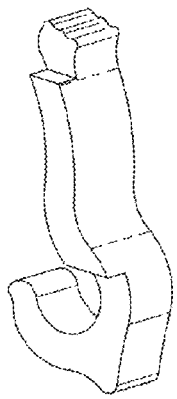
FIG. 8B is a perspective view of the transversal in FIG. 8A

In contrast in the embodiment shown in FIGS. 6A and 6B, the curved surface appendage 137 is disposed away from the end 134, which has an edge 135 on lower region of a reversing basal region curvature 132 having a beak like appearance.

It should now be appreciated that as the internal U shaped surface of the forked regulator 120 preferably has two opposing pairs of internal protuberances 1241 and 1241'. Thus, appendage 137 and/or edge 135 will be forced against these protuberances as the transversal 130 is urged downward by the DUT. This contact will provide further resistive force and increase the local pressure that the ridges 138 have against the terminals 11 of a DUT 10, as well as congruently provide further redundant electrical contact between the transversals' abridged curved appendage 137 and the regulator 120 to govern the amount of tangential contact pressures herein.

A tuning feature that may be implemented to fine-tune, sustain high volume testing, or to further regulate contact force efficiencies to the DUT and/or contact pressure between the transversal and regulator. For example, the transversals 130 in FIGS. 5B and 6B also have a shoulder 133 that extends laterally from just a portion of the armature 131 of the transversal 130. It should be noted that in the various embodiments in FIGS. 5-14 the vertical face 133a of shoulder 133 is not flat but is curved with respect to the vector plane of FIG. 14B. When these shoulders 133 and 133' abut as shown in FIG. 14B, the downward movement of the DUT 10 also results in lateral outward or diverging motion of the ridges 138 in a second orthogonal plane as they move closer in the first plane due to the scissor like movement of the transversals 130 and 130'. It should be appreciated that the upper appendage 136 surface of the transversal that contacts the terminal 11 may be different than that illustrated herein depending on the precise movement of this surface as optimized to contact the particular shape, size, spacing and also taking into consideration the alloy composition of DUT terminal 11.

Figure 9A:
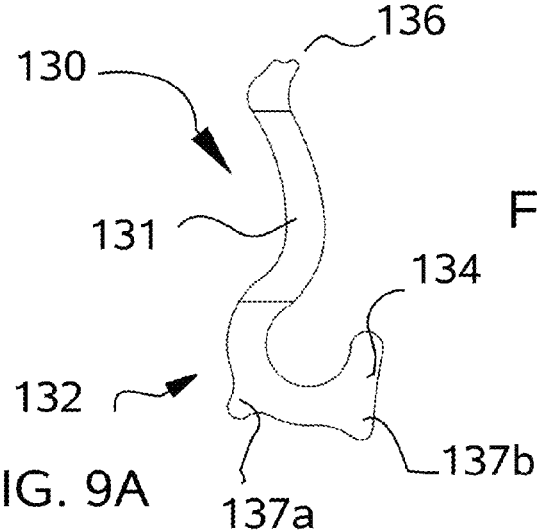
FIG. 9A is an external elevation of a particular embodiment for a transversal
Figure 9B:
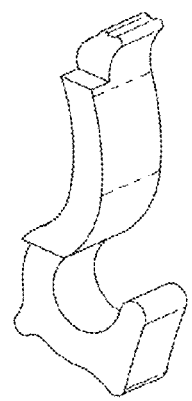
FIG. 9B is a perspective view of the transversal in FIG. 9A
Figure 10A:
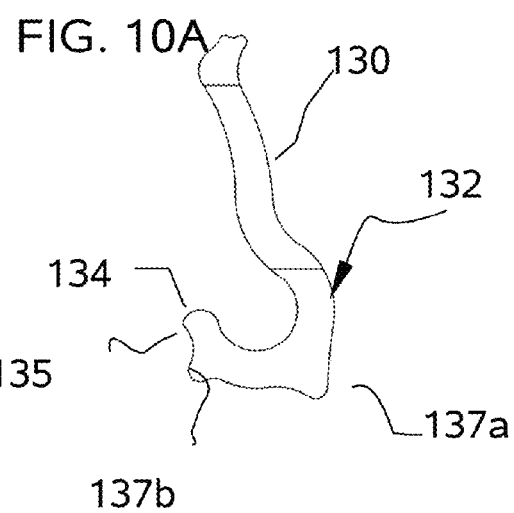
FIG. 10A is an external elevation of a particular embodiment for a transversal
Figure 10B:
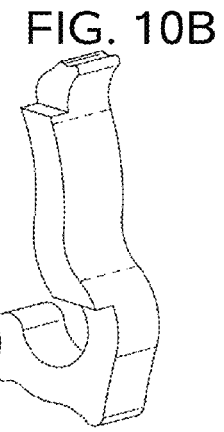
FIG. 10B is a perspective view of the transversal in FIG. 10A
Figure 11A:
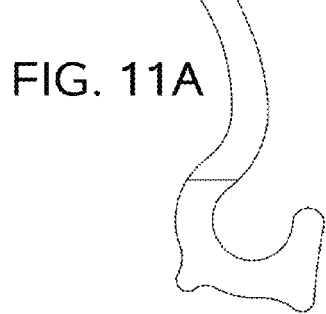
FIG. 11A is an external elevation of a particular embodiment for a transversal
Figure 11B:
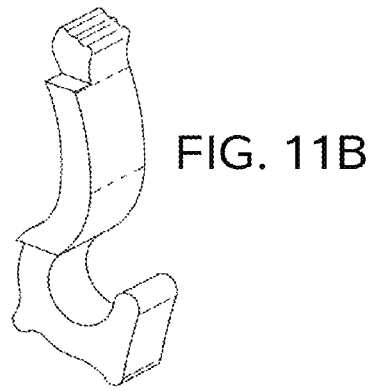
FIG. 11B is a perspective view of the transversal in FIG. 11A
Figure 12A:
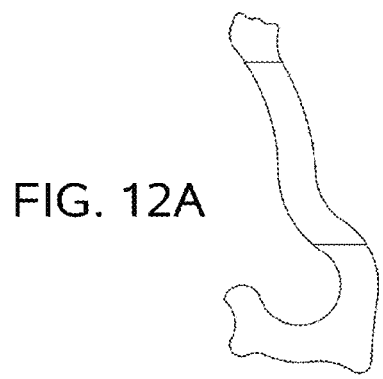
FIG. 12A is an external elevation of a particular embodiment for a transversal
Figure 12B:
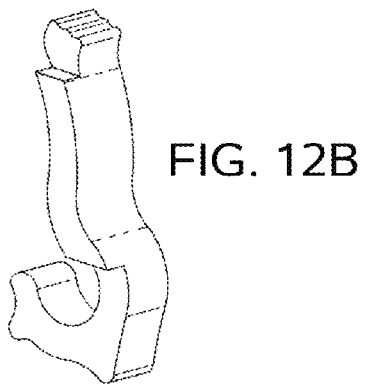
FIG. 12B is a perspective view of the transversal in FIG. 12A
Figure 13C:
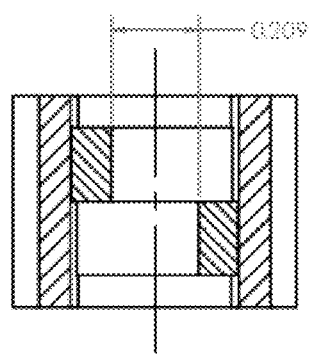
Figure 13D:
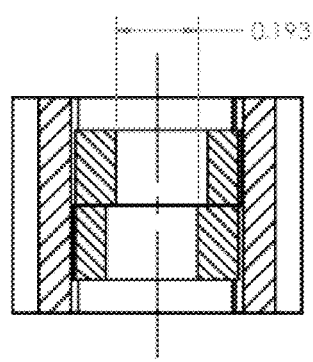
Figure 13E:
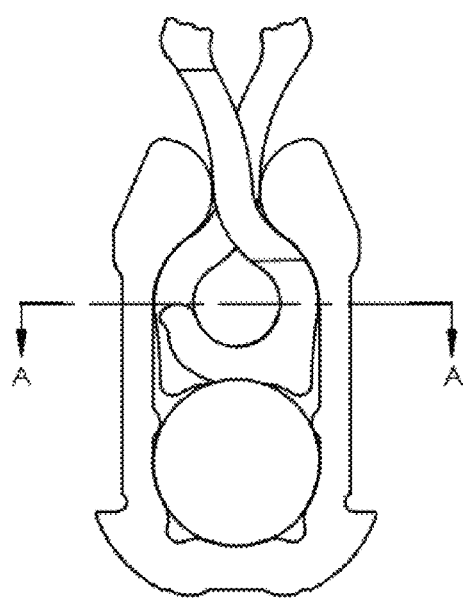
FIGS. 13E and 13F are the corresponding cross-sectional elevations.
Figure 13F:
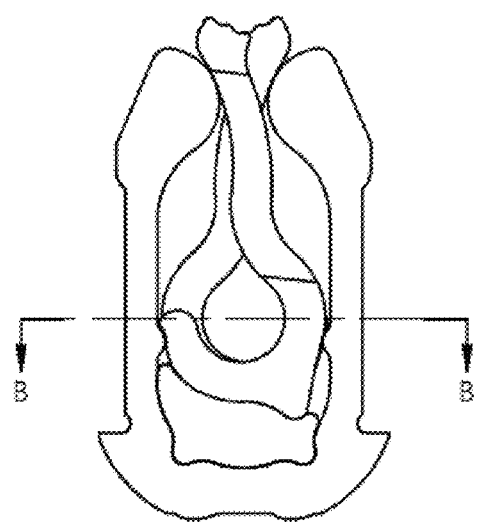

FIGS. 9AB-12AB illustrate further alternative embodiments of the transversal 130 with various shaped multiple appendages 137 along the basal region 132 that can further optimize the interaction with the regulator's internal protuberance 1241. As for example, in FIG. 10AB, the basal region 132 of transversal 130 has a first appendage 137a comparable to that shown in FIGS. 5-6, but with an additional appendage 137b below edge 135. Such appendages 137 intended to abut internal protuberance 1241 of regulator 120 and can generally be defined by the departure from the continuous curvature that may be characterized by the first radius $R_1$ (as shown in FIG. 5A). The appendage 137 extends outward from the region of radius $R_1$ having a second radius $R_2$ that is much smaller than $R_1$. It should be noted that $R_3$ is generally greater than $R_1$, and $R_1$ is generally greater than $R_4$. $R_2$ and $R_4$ are about the same size, with $R_5$ preferably greater than $R_4$.

Figure 16:
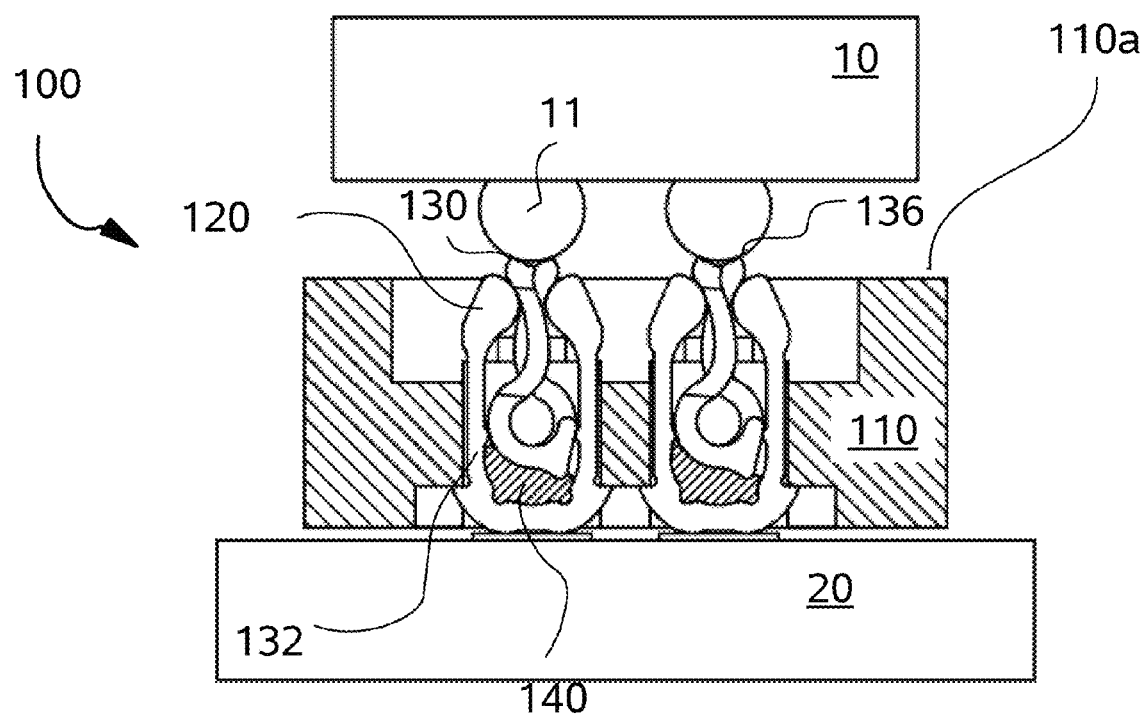
FIG. 16 a cross-sectional elevation view of a portion of the test module in showing a portion of a Ball BGA device under test on the load board.

Of particular note, the upper appendage 136 in the transversal 130 of FIGS. 7, 8, 11-12A/B and FIG. 16 are particularly adapted for contacting the external contact of a Ball BGA IC package.

Figure 15:
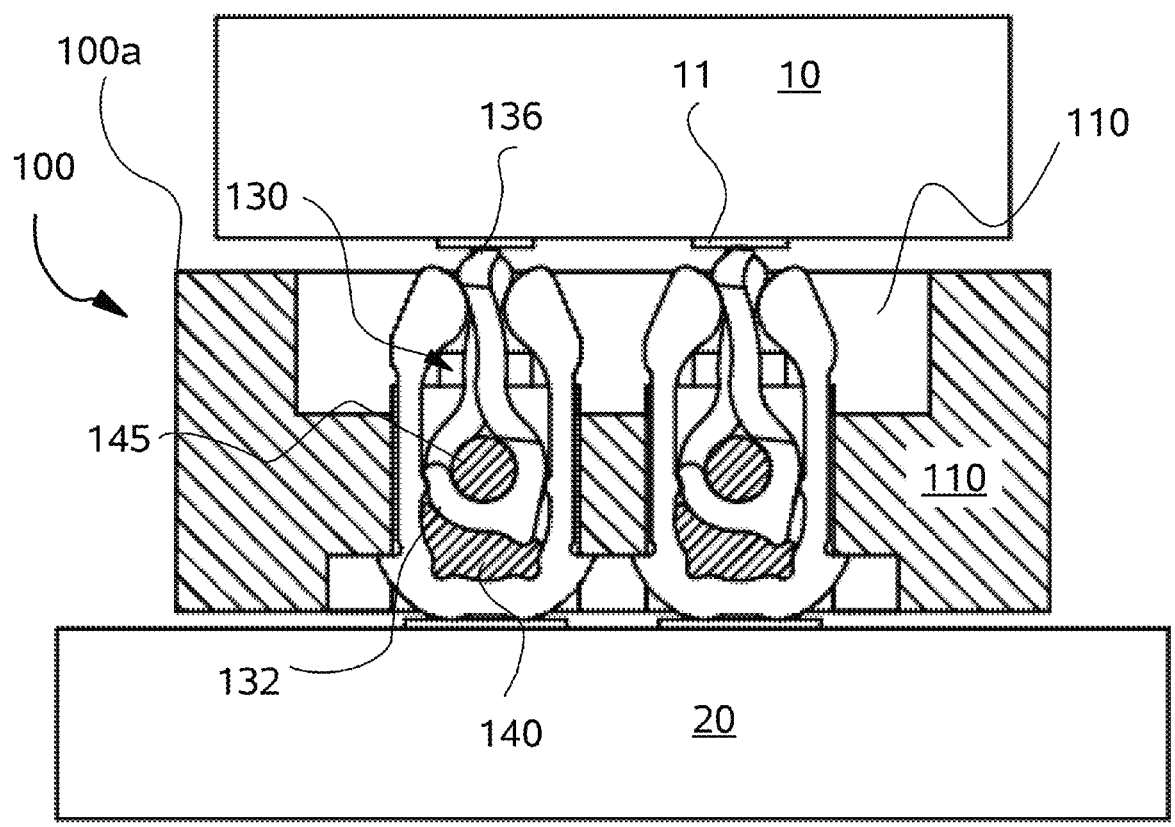
FIG. 15 is a cross-sectional elevation view of a portion of the test module in showing a portion of a PAD LGA device under test on the load board.

In contrast, the upper appendage 136 in the transversal 130 of FIGS. 5, 6, 9, 10A/B and FIG. 15 are particularly adapted for contacting the typical external contact of a pads LGA, QFN, MLF, DFN, and dual row staggered formation IC packages, as well as leaded applications such as QFP, SO, SOT, and TSOP microcircuit terminals.

Of further note, the transversal 130 shown in FIGS. 9A/B has a first appendage 137*a* on the basal region 132 distal from the end 134, and generally below the downward projection of the armature 131, and an additional appendage 137*b* just below end 134.

FIGS. 13A/B and 14A/B compare alternative ways of orienting adjacent transversals 130 and 130'. In FIGS. 13A and B, shoulders 133 and 133' face way from each other, whereas in FIGS. 14A/B they are adjacent to the spaced apart the basal regions 132 and 132'. The embodiment of FIGS. 13 and 14 are preferable when deploying an additional resilient means to elastic cord 140. As the transversals 130 and 130' in this arrangement will move in opposite direction within the forked regulator 120, the lumen 139 will decrease slightly in diameter, which is resisted by the cord 145, resulting in greater force on the IC contact 11, and congruously ensures a unison pair profile exchange force of transversal appendage 137, specifically having radius $R_5$, and regulator protuberant 1241 at the corresponding point of movement to further sustain pressure at this reference.

The cord 145 is preferably compressible when the full height of the transversals 130 and 130' make lateral contact (FIGS. 13A-F) since shoulders 133 and 133' face away from each other. However, the cord 145 is preferably flexural, and less compressible when the transversals 130 and 130' are separated by abutting shoulders 133, which causes the cord 145 to deflect or kink within the wide gap in the lumen 139 between the basal regions 132 and 132' of each transversal.

As shown in the embodiment of the transversal 130 in FIGS. 17A and 17B, the shoulder of the rounded basal region is on the opposite side with respect to the upper abridged appendage 136; and as illustrated in FIGS. 14A/B as a segregate rounded basal pair alternative to that of an adjoining rounded basal pair as designated in FIGS. 13A/B implies deploying an intervening resistive deflection to the elastic cord 140 accordingly to moreover attain a durable compressional life expectancy with coalition of a predicated material grade elastic cord.

The various embodiment described herein are believed capable of meeting the following mechanical specifications: 1) a 0.5-1.27 mm terminal pitch, 2) a Junction Length 1.16 mm, 3) Test State Height 1.16 mm, 4) Contact Compliance 0.22 mm, 5) Lateral Contact Translation to terminal (each direction 0.089 mm (0.0035"), 6) Contact Force 30-40 grams, 7) Temperatures −40° C. to 155° C., 7) Contactor Life (Insertions) Elastomers =300,000 , 9) Contacts =300,000 and 10) Housing cycle life =2 M.

Kelvin testing is a known requirement for very low contact resistance sensitive devices whereby system fixture resistance is cancelled out to measure DUT resistance solely, and is hence a practicable requisite with some sensitive devices whereby fixture resistance is comparable to the DUT resistance being measured. FIGS. 18A-C, thus illustrate another embodiment of the invention in which the regulator and transversal assembly 1800 is capable of being deployed for Kelvin testing. In this embodiment, the regulator 120 is bisected or split into two conductive halves, that is front half 120' and rear half 120" each inverted from the other and separated by a dielectric bridge portion 1805. The dielectric bridge portion 1805 is preferably about two to three mil (0.002"-0.003") thick dielectric or insulating material to provide electrical isolation of front half 120' and rear half 120' resulting in essentially two connections per DUT terminal & corresponding board terminals. The dielectric bridge portion 1805 has the same general lateral profile of the regulator with a hole or bore 1806 to accommodate the elastic cord 140, if desired. However, it is preferable that the bottom of the dielectric spacer 1805 closest to the test board 20 does not include and ridges that are intended to rest on the test board 20 as described below. Thus, the front 130' and rear 130" transversals will both contact the same external terminal of the DUT, but will make separate electric contact with the respective front 120' and rear 120" halves of the regulator that are electrically isolated by the dielectric plate or bridge 1805. The test board 20 (of which a portion corresponding to the projected perimeter of the basal region 124 is shown in FIG. 18B as broken line 1820) has two electrically isolated test pads 21' and 21". The basal region 124 of the regulator is also subdivided by the dielectric spacer or bridge portion 1805, with each half having surface ridges 1827' and 1827" for making electric contact with isolated test pads 21' and 21" respectively. The bottom of the basal region 124 also has a second pair of additional ridges 1828' and 1828" disposed opposite the first pair of ridges 1827' and 1827", but are not intended to contact the isolated test pads 21' and 21", but rather to rest on the dielectric or electrically isolated portion of the test board 20 to provide mechanical stability with 4 points of mechanical contacts to the face of the test board 20. Thus each ridge 1828' and 1828" of the second pair of ridges is preferably set inward from the corner of the basal region 124 (i.e. closer to the centerline of the regulator 120 than each ridge in the first pair) to provide additional clearance about the test pads 21' and 21", which can be slightly oversized with respect to the ridges 1827' and 1827" to overcome any variance in alignment in manufacturing or use. It should be noted further that the ridges 1827' and 1827 of the first pair are disposed at diagonal corners of the basal region 124 to provide a greater separation of the test pads 21 and 21" than the thickness of the dielectric spacer or bridge 1805, thus further enabling oversizing of isolated test pads 21' and 21" also providing a much larger tolerance to potential manufacturing variations on the test board 20.

Thus, by supplying pairs of insulated hard lines on the test board 20 to the test pads 21' and 21" it is possible to make Kelvin measurements and hence cancel fixture resistance at the DUT terminal that contacts transversals 130' and 130". The insulated hard lines to test pads 21' and 21" thus permit the the measurement of electric current via force leads coming from a source to one test pad and the via sense leads coming from a voltmeter to the other test pad.

While the invention has been described in connection with a preferred embodiment, it is not intended to limit the scope of the invention to the particular form set forth, but on the contrary, it is intended to cover such alternatives, modifications, and equivalents as may be within the spirit and scope of the invention as defined by the appended claims.

I claim:

1. A test module for supporting and making electrical contact and external signal connection to a device under test (DUT) having a plurality of external terminals, the test module comprising:

a) a generally planar dielectric housing having an upper surface, a lower surface and
a) plurality of cavities that extend generally vertically from the upper surface to the lower surface,
b) a forked regulator disposed in at least a portion of the plurality of cavities and having a base and a pair of arms that extend upward from the base,
c) at least one transversal disposed in rotary engagement within said forked regulator and having;
  i) a rounded basal region for permitting rotary motion within the regulator, and
  ii) a curved armature extending upward from the basal region beyond the pair of arms of the forked regulator and terminating in an upper appendage having an upward facing surface for making a signal transmitting contact with external terminals of a DUT,
  iii) means for rotary movement of the basal region of the transversal within said forked regulator whereby an external terminal of a DUT impinging vertically on the upper appendage results in the vertical and then horizontal movement in a first lateral direction thereof with respect to an initial point of contact of the external terminal of the DUT.

2. A test module according to claim 1 in which the forked regulator and the transversal are electrically conductive and make multiple points of contact with each other when the external terminal of the DUT are urged vertically downward onto the test fixture such that the upper appendage thereof first undergoes a vertically downward displacement and then horizontal movement in a first lateral direction thereof with respect to an initial point of contact with the external terminal of the DUT.

3. A test module according to claim 1 that further comprises a second transversal disposed in rotary engagement within said forked regulator and having;
  i) a rounded basal region for permitting rotary motion within the regulator, and
  ii) a curved armature extending upward from the basal region beyond the pair of arms of the regulator and terminating in an upper appendage having an upward facing surface for making signal transmitting contact with the same external terminal of the DUT as the first transversal,
  iii) wherein each transversal undergoes rotary movement in the opposite direction of the other transversal within the region of the regulator between the base and the pair of arms that extend upward from the base.

4. A test module according to claim 1 wherein a plurality of the cavities within the generally planar dielectric housing have a central portion having a first width and a lower opening that extends to the lower surface having a second width that is larger than the first width.

5. A test module according to claim 1 wherein a plurality of the cavities within the generally planar dielectric housing have a central portion having a first width and an upper opening that extends to the upper surface having a third width that is larger than the first width.

6. A test module according to claim 4 wherein a plurality of the cavities within the generally planar dielectric housing have a central portion having a first width and an upper opening that extends to the upper surface having a third width that is larger than the first width.

7. A test module according to claim 4 wherein the base of said forked regulator has a lower surface which comprises at least 2 lower surface ridges, said ridges being capable of descending below the lower surface of the generally planar dielectric housing for making electrical contact with a test board.

8. A test module according to claim 4 wherein the base of said forked regulator has two outwardly projecting external flanges for containing it within said central cavity, the outwardly projecting flanges having a width greater than the first width and smaller than the second width of the lower opening of the central cavity.

9. A test module according to claim 1 in which each of the arms in said forked regulator terminate in upper extremities that are wider than a lower portion thereof to form a choke region having a lateral gap of a first width through which the curved armature of said transversal extends(,) the first width being less than diameter of the rounded basal region thereof.

10. A test module according to claim 9 in which the upper portion of the choke region extends above the upper surface of the generally planar dielectric housing.

11. A test module according to claim 3 in which the rounded basal region of each transversal is generally hook shaped and has an inner bore, wherein the inner bore of the two transversals define a common lumen that extends laterally in a plane parallel with the plane of the generally planar dielectric housing.

12. A test module according to claim 11 in which one of an elastic cord and a resilient member fill the common lumen.

13. A test module according to claim 9 in which the upper extremities of the forked regulator terminate in upper surfaces that are sloped diagonally, the slope of each upper surface progressing outward from the lateral gap as it ascends upward.

14. A test module according to claim 3 in which the upward facing surfaces on the appendages of the transversals have ridges that extend in a first horizontal direction that is parallel to a common rotary axis of the transversals.

15. A test module according to claim 13 in which the arms of the regulator and upper extremities thereof have internal facing surfaces that are curved to define a bell shaped cavity that confines the rounded basal regions of the transversal below the choke region of the regulator.

16. A test module according to claim 14 in which the internal facing surfaces of the forked regulator have a pair of opposing internal protuberances disposed generally below the opposing arms thereof.

17. A test module according to claim 1 wherein the regulator is split into 2 conductive halves that are separated by a dielectric bridge portion that extends vertically from the base region to the arms thereof.

18. A test module according to claim 3 wherein the regulator is split into 2 conductive halves that are separated by a dielectric bridge portion that extends vertically from the base region to the arms thereof wherein each transversal makes electrical contact with a single associated conductive half.

19. A process for testing an electrical device with a plurality of co-planar external electrical contacts, the process comprising the steps of:
  a) providing the test module of claim 1,
  b) providing a device,
  c) depressing the device to make contact with the transversals of the test module,
  d) testing the device electrically by applying at least one of power and signal to at least a portion of the external contacts thereof via the test module,
  e) removing the device.

20. A process for testing an electrical device with a plurality of co-planar external electrical contacts, the process comprising the steps of:
   f) providing the test module of claim 17,
   g) providing a device,
   h) depressing the device to make contact with the transversals of the test module,
   i) Kelvin testing the device electrically by applying at least one of power and signal to at least a portion of the external contacts thereof via the test module,
   j) removing the device.

* * * * *